United States Patent

Akyurek

[11] 4,194,668
[45] Mar. 25, 1980

[54] APPARATUS FOR ALIGNING AND SOLDERING MULTIPLE ELECTRODE PEDESTALS TO THE SOLDERABLE OHMIC CONTACTS OF SEMICONDUCTOR COMPONENTS

[75] Inventor: Altan Akyurek, Heppenheim, Fed. Rep. of Germany

[73] Assignee: BBC Brown Boveri & Company Limited, Baden, Switzerland

[21] Appl. No.: 858,340

[22] Filed: Dec. 7, 1977

[30] Foreign Application Priority Data

Dec. 10, 1976 [DE] Fed. Rep. of Germany ....... 2656019

[51] Int. Cl.² ............................................... B23K 1/12
[52] U.S. Cl. .................................... 228/6 A; 29/729; 29/821
[58] Field of Search .............. 228/4.1, 5.1, 6 R, 6 A, 228/44.1 A, 123; 29/821, 739, 729, 589, 428

[56] References Cited

U.S. PATENT DOCUMENTS

| | | |
|---|---|---|
| 3,080,841 | 3/1963 | Nobel .................................. 29/589 X |
| 3,369,290 | 2/1968 | Mayer et al. ..................... 228/123 X |
| 3,414,962 | 12/1968 | Altamura ................................. 29/428 |
| 3,736,651 | 8/1973 | Law et al. ............................... 29/428 |
| 3,982,979 | 9/1976 | Hentz et al. ................. 228/180 R X |
| 4,018,373 | 4/1977 | Beerwerth et al. ............ 228/44.1 A |

Primary Examiner—Charlie T. Moon
Assistant Examiner—K. J. Ramsey
Attorney, Agent, or Firm—Oblon, Fisher, Spivak, McClelland & Maier

[57] ABSTRACT

An apparatus for aligning and soldering electrode pedestals to the solderable ohmic contacts of individual semiconductor components formed by an undivided silicon wafer. The apparatus includes a soldering assembly for receiving the undivided silicon wafer and for temporarily retaining the electrode pedestals in alignment on the silicon wafer during the soldering of the pedestals to the ohmic contacts; a pedestal mask which is placed over the undivided silicon wafer and which aligns individual pedestals over the ohmic contacts of the silicon wafer; and a shaker apparatus coupled to said soldering base plate for distributing the electrode pedestals to each of the ohmic contacts.

9 Claims, 5 Drawing Figures

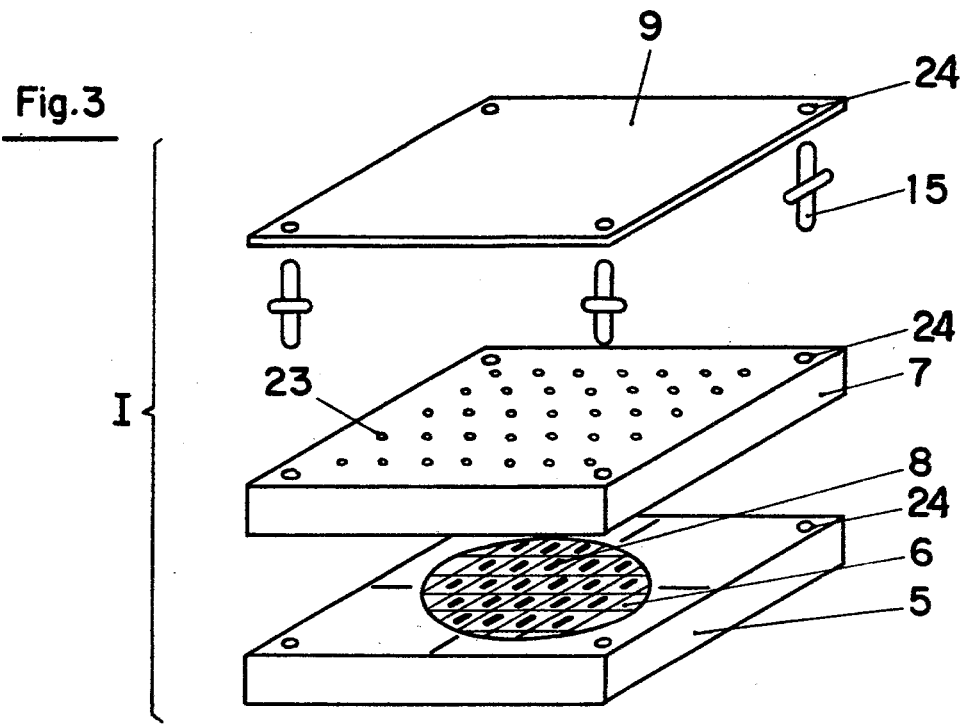
Fig.3
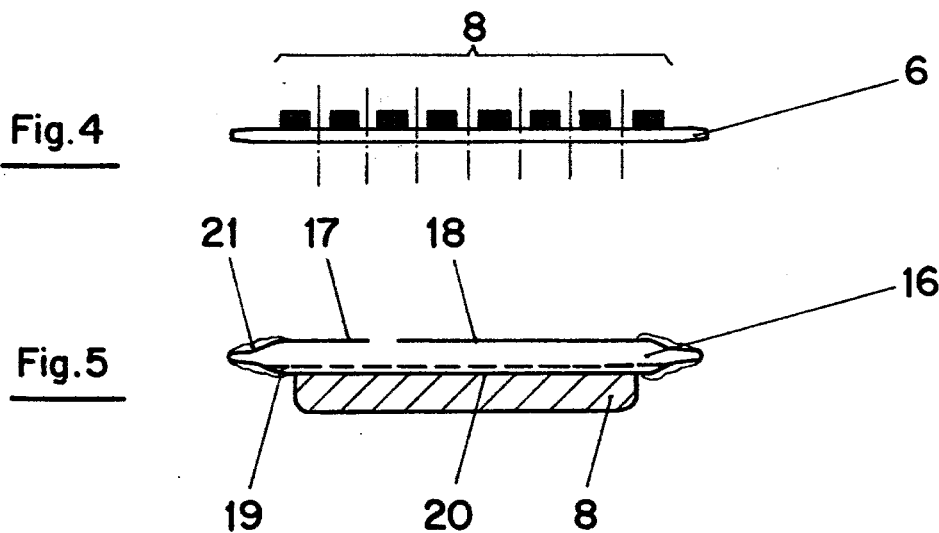
Fig.4
Fig.5

APPARATUS FOR ALIGNING AND SOLDERING MULTIPLE ELECTRODE PEDESTALS TO THE SOLDERABLE OHMIC CONTACTS OF SEMICONDUCTOR COMPONENTS

BACKGROUND OF THE INVENTION

1. Field of the Invention

This invention relates to the mass production of semiconductor devices, such as thyristors, and more particularly, to an apparatus for aligning and soldering pedestals or disks to the solderable ohmic contacts of semiconductor components.

2. Description of the Prior Art

It is generally known that semiconductor components can be produced starting with a diffused, i.e. exhibiting at least two zones of differing conductivity types, silicon wafer. The silicon wafer is divided into semiconductor chips by etching the wafer into a grid pattern. The individual semiconductor components are provided with solderable ohmic contacts (electrodes) and with layers of glass passivation, at least around the edge.

It is known (DT-OS 2,400,863) how to provide a pedestal or disk for connection to an external anodic terminal so that in the region of the mesa edge of the semiconductor component protected by the glass passivation, the solder spots necessary for the anode terminal and the pn-junction are kept well apart in this region. At the same time the pedestal, of course, acts as a current conductor and as a means of carrying off the heat generated. In the known case the pedestal next to the anode electrode is aligned with a cooling fin comb. This cooling fin comb is located on the side away from the electrode and is pre-attached by thermo-compression. On the other side of the semiconductor chip is laid a double comb made of two combs of different sheet thicknesses. The double comb is provided with contact legs and additional contact vanes. The contact leg acts as a control electrode terminal, while the contact vane acts as an emitter electrode terminal. Cooling fins, contact legs and contact vanes are soldered to their respective electrodes in one process. In the known method for producing semiconductor chips, the silicon wafer has already been divided into individual semiconductor chips before electrode pedestals are attached. However, it is more economical in the production process to carry out as many operations as possible on the undivided wafer.

SUMMARY OF THE INVENTION

Accordingly, one object of this invention is to provide a novel apparatus by which semiconductor chips are economically produced.

Another object of this invention is to provide a novel apparatus for aligning and soldering electrode pedestals to the solderable ohmic anodic contacts of semiconductor chips.

A further object of this invention is to provide a novel apparatus for aligning and soldering electrode pedestals to the solderable ohmic anodic contacts of the individual semiconductor chips of an undivided silicon wafer.

These and other objects of this invention are achieved by providing an apparatus for soldering electrode pedestals to the ohmic anodic contacts of the individual semiconductor chips of an undivided silicon wafer. The apparatus consists of an electromagnetically driven shaking machine, a soldering base plate for receiving an undivided silicon wafer, a mask, a removable upper part for temporary retention of the pedestals, and a removable top plate.

The soldering base plate is placed on the shaking machine. Thereafter the silicon wafer is mounted on the soldering base plate, and the mask is then lowered over the wafer with the holes of the mask aligned with the solderable anodic contacts of the wafer. Electrode pedestals are then sprinkled onto the mask and shaken onto the solderable anodic contacts via the mask holes, one pedestal per anodic contact. When all mask holes are filled with a single pedestal, the upper retention part and the removable top plate are united by alignment pins to form a soldering assembly. This soldering assembly is then transported to a continuous soldering oven for soldering in a hydrogen atmosphere. After soldering, the undivided silicon wafer is removed from the soldering assembly and cut into separate semiconductor chips.

The soldering base plate is advantageously made of graphite and acts as a template so that the silicon wafer once placed on this plate remains on the soldering base plate during the soldering process.

The mask preferably has a grid structure and is made of bronze. The pedestals, preferably of molybdenum and pretinned on at least one side, are applied static-free by such a mask to the silicon wafer in accordance with the mask grid pattern. The removable top plate is preferably constructed of relatively heavy austenitic steel.

The electromagnetically driven shaker has a gently sloped feed surface with sorting chutes and a selector comb, as well as suction cups for holding the soldering template fastly to the shake table adjoining the feed surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 is an exploded drawing of the soldering assembly, including the silicon wafer on the soldering base plate, the upper retention part, removable top plate and alignment pins.

FIG. 4 is a silicon wafer with soldered pedestals.

FIG. 5 is a semiconductor chip with soldered pedestal soldered.

DESCRIPTION OF THE PREFERRED EMBODIMENTS

Figure 1:
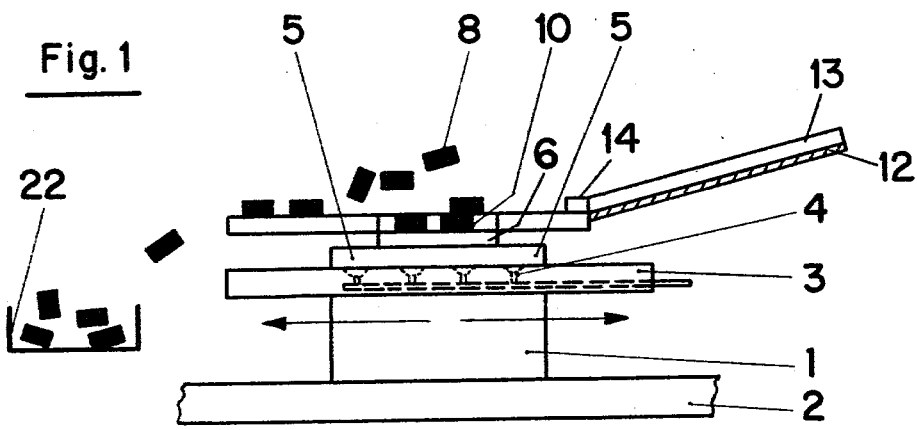
FIG. 1 is a side view of a shaker mechanism on which is placed a soldering base plate.

Referring now to the drawings, wherein like reference numerals designate identical or corresponding parts throughout the several views, and more particularly to FIG. 1 thereof, the apparatus disclosed herein is seen to include an electromagnetically driven shaker 1, mounted on a shaker base plate 2 and provided with a shake table 3 having pneumatic suction cups 4. Lying on the shake table 3 is a soldering base plate 5. The soldering base plate 5 is fastly held to the shake table 3 by the suction cups 4, and is in the form of a soldering template. As shown in FIG. 3, the soldering base plate receives an undivided silicon wafer 6, a removable upper part 7 for temporary retention of the pedestals 8 and a removable top plate 9, which together form a pedestal soldering assembly, generally indicated as I.

Figure 2:
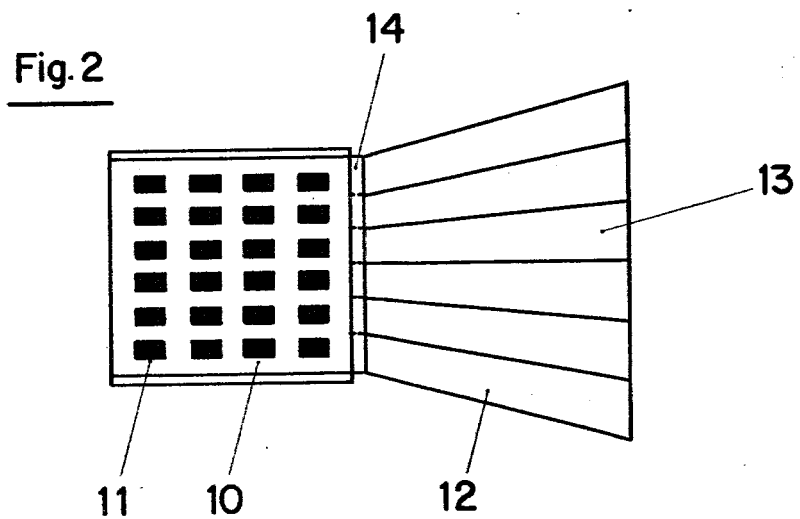
FIG. 2 is a top view of the assembly of FIG. 1.

As illustrated in FIGS. 1–3 a mask 10 with openings 11 somewhat larger than the pedestals 8 and having a grid structure matching that of the silicon wafer 6 is placed over the wafer 6 on the soldering base plate 5. Adjoining the mask 10 is a feed surface 12 sloping gently towards the mask 10. The feed surface 12 is provided with sorting chutes 13 and a selector comb 14 (FIG. 2).

The soldering base plate 5 with the silicon wafer 6 mounted on the plate 5, the upper part 7 and the plate 9 are connected by means of aligning pins 15 (FIG. 3) to form the pedestal soldering assembly I.

In FIG. 5 an individual semiconductor chip 16 is indicated as having a gate 17, a cathode 18, a pn-junction (shown dashed) 19 and a lower anode electrode 20 with the pedestal 8 soldered thereon. The semiconductor chip 16 possesses, in known manner, a beveled mesa-edge with a glass passivation 21 for increasing the inverse voltage rating.

The operation of the apparatus is now described.

The soldering base plate 5 of the soldering assembly I is placed on the shake table 3 of the shaker 1. The already glass passivated silicon wafer 6 is mounted on the base 5, anode side up. The mask 10 is placed on the silicon wafer 6 such that the anode surfaces communicate with openings 11 in the mask 10. The pedestals 8 are then sprinkled onto the mask 10, or allowed to slide down the feed surface 12 to the mask 10. The shaker 1 is set in motion so that all holes 11 in mask 10 receive pedestals 8. The mask 10 is fixed with respect to the wafer and the distance between the mask 10 and the anode surfaces is set so that no more than one pedestal 8 is retained on any one anode surface. During the shaking the soldering base plate 5 is held down on the shake table 3 by the action of the pneumatic suction cups 4. After the filling of all the holes 11 with pedestals 8, all anode surfaces are covered with pedestals 8, and the excess pedestals 8 are bounced into a collection tray 22 shown on the left side of FIG. 1. The feed surface 12 and chutes 13 align the pedestals 8. The comb 14 separates the pedestals 8 so that they arrive one after another at the rows of holes 11 in the mask 10.

When the mask 10 is filled, the shaker is turned off and the mask is raised and removed. The pedestals 8 are now aligned on the anode side of the silicon wafer 6. In accordance with FIG. 3 the upper part 7 and the top plate 9 are now connected to one another and the soldering base plate 5 by the aligning pins 15 inserted through corresponding borings 24. The plate 9 itself serves as a weight or the plate 9 can be additionally loaded. The assembled pedestal soldering assembly I is now transportable. It is placed in a continuous soldering oven and the soldering process proceeds under a hydrogen atmosphere. The upper part 7 can have perforations 23 to facilitate heating, and the aligning pins can be shaped so that a gap exists between the top plate 9 and the upper part 7. After the soldering process is finished, the silicon wafer, now with contacts, is removed from the soldering assembly I, scored in the usual manner (laser beam, sand jet or diamond saw) and broken into separate semiconductor chips 16 along the broken lines indicated in FIG. 4. Each element or semiconductor chip 16, as shown in FIG. 5, has a pedestal 8 on its anode side. An external anode lead can now be soldered advantageously to the pedestal 8 and with no danger to the neighboring pn-junction. It is advisable to tin the pedestal 8 on both sides with a soft solder, e.g. lead-silver or lead-tin solder to facilitate this subsequent soldering process, as well as the soldering of the pedestal 8 to the semiconductor wafer 6.

Obviously, numerous modifications and variations of the present invention are possible in light of the above teachings. It is therefore to be understood that within the scope of the appended claims, the invention may be practiced otherwise than as specifically described herein.

I claim:

1. An apparatus for aligning and soldering pedestals to the solderable ohmic contacts of individual semiconductor components formed by an individual silicon wafer, comprising:

an electromagnetically driven shaker table having a gently sloped pedestal feed surface having pedestal sorting chutes and a pedestal selector comb, said comb adapted to be disposed adjacent said wafer so that pedestals located on said feed surface can be distributed to said ohmic contacts of said wafer;

mask means for aligning said pedestals over said ohmic contacts;

means for maintaining said mask means in a fixed position respective to said silicon wafer adjacent said comb;

a removable mounting and soldering base plate removably mounted on said shaker table and adapted to support on said shaker table said wafer with said mask means placed over said wafer for distribution of the pedestals onto the ohmic contacts; and soldering assembly means for receiving said base plate with said undivided wafer having said pedestals distributed thereon, said soldering assembly means comprising a removable upper retention part adapted to be coupled to said base plate after distribution of said pedestals with said wafer retained between said base plate and said retention part, and a removable top part supported on said retention part, and means for coupling said base plate, said retention part, and said top part for retaining said pedestals in alignment on said silicon wafer during removal of said base plate from said shaker table and during soldering of said pedestals to said ohmic contacts.

2. An apparatus according to claim 1 wherein said mask means further comprises:

a bronze grid structure.

3. An apparatus according to claim 1 wherein said removable top plate of said soldering assembly means comprises:

a relatively heavy plate of austenitic chrome-nickel steel.

4. An apparatus according to claim 1 wherein said shaker table of said shaker means further comprises:

pneumatic suction cup means for holding said soldering base plate firmly to said shaker table.

5. An apparatus for aligning and soldering pedestals to the solderable ohmic contacts of individual semiconductor components formed by an undivided silicon wafer, said device comprising:

shaker means for distributing said pedestals in alignment over said ohmic contacts on said wafer, said shaker means comprising a shaker table, means for removably mounting a graphite mounting and soldering base plate on said shaker table during aligning of said pedestals on said wafer, said base plate adapted to have said wafer mounted thereon, a removable latticed mask adapted to be temporarily mounted over said wafer on said base plate for alignment of said pedestals on said wafer, said shaker table including a feeding plate adjoining said mask and equipped with sorting grooves for directing said pedestals to respective components, wherein during alignment of said pedestals over said ohmic contacts of said components, said table with said base plate, said wafer, and said mask respectively mounted thereon may be shaked such that a pedestal is distributed to each ohmic contact through said mask, said mask thereafter removed from said base plate; and, soldering assembly means for receiving said undivided silicon wafer and for temporarily retaining said pedestals in alignment on said silicon wafer during soldering of said pedestals to said ohmic contacts, said soldering means comprising said base plate removed from said shaker table, a removable upper retention part for maintaining said pedestals in alignment and adapted to be maintained on said wafer with the pedestals aligned thereon, a removable top plate mounted on said upper retention part for maintaining said upper retention part and said pedestals in place, and soldering assembly alignment pins maintaining said base plate, said upper retention part, and said top plate in alignment during soldering of said pedestals to said ohmic contacts, said base plate acting as a template and adapted to maintain said wafer in place during the soldering of said pedestals.

6. An apparatus according to claim 5 wherein said mask comprises: a bronze mask.

7. An apparatus according to claim 5 wherein said shaker means further comprises:
electromagnetic driver means for vibrating said shaker table; and,
said shaker table further comprises a selector comb adjoining said mask for separating said pedestals during distribution of said pedestals to said mask.

8. An apparatus according to claim 5 wherein said top plate of said soldering assembly means comprises: austenitic chrome-nickel-steel.

9. An apparatus according to claim 5 wherein said shaker table futher comprises:
pneumatic suction cup means for holding said base plate firmly to said shaker table.

* * * * *